(12) United States Patent
Ma et al.

(10) Patent No.: US 8,302,261 B2
(45) Date of Patent: Nov. 6, 2012

(54) ELECTRONIC DEVICE AND HINGE THEREOF

(75) Inventors: Xian-Wei Ma, Shenzhen (CN); Ting Luo, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

(*) Notice: Subject to any disclaimer, the term of this patent is extended or adjusted under 35 U.S.C. 154(b) by 332 days.

(21) Appl. No.: 12/770,766

(22) Filed: Apr. 30, 2010

(65) Prior Publication Data

US 2011/0133619 A1    Jun. 9, 2011

(51) Int. Cl.
*E05D 11/10* (2006.01)
(52) U.S. Cl. ......... 16/332; 16/326; 16/308; 361/679.27; 248/922
(58) Field of Classification Search ............ 16/332, 16/324, 326, 327, 297, 308, 340, 375, 250; 379/433.13; 455/575.3; 361/679.27; 248/919–923
See application file for complete search history.

(56) References Cited

U.S. PATENT DOCUMENTS

| | | | | |
|---|---|---|---|---|
| 5,465,191 A * | 11/1995 | Nomura et al. | ......... | 361/679.27 |
| 5,497,296 A * | 3/1996 | Satou et al. | ......... | 361/679.09 |
| 6,034,867 A * | 3/2000 | Seo | ......... | 361/679.27 |
| 6,654,233 B2 * | 11/2003 | Tseng et al. | ......... | 361/679.27 |
| 8,046,874 B2 * | 11/2011 | Cheng | ......... | 16/324 |
| 8,068,334 B2 * | 11/2011 | Tang | ......... | 361/679.27 |

FOREIGN PATENT DOCUMENTS

TW    200934241    8/2009

\* cited by examiner

*Primary Examiner* — William L. Miller
(74) *Attorney, Agent, or Firm* — Altis Law Group, Inc.

(57) ABSTRACT

A hinge comprises a rotatable bracket, a fixed bracket, a torsion spring, a locknut element and a shaft penetrating through the rotatable bracket, the fixed bracket, the spring and the locknut element. The rotatable bracket forms a through hole therein. The hinge further comprises an elastic hook and a driving element. The elastic hook is inserted into the through hole of the rotatable bracket to lock the electronic device when the electronic device is closed. A driving element mounted in the main body receives an operation of the user to push the elastic hook out of the through hole in order to open the electronic device.

18 Claims, 5 Drawing Sheets

ELECTRONIC DEVICE AND HINGE THEREOF

BACKGROUND

1. Technical Field

The present disclosure relates to electronic devices and, particularly, to an electronic device with a hinge and a concealed hook in the hinge.

2. Description of Related Art

Electronic devices, such as a notebook computer, usually include a body, a cover, a hinge pivotably connecting the cover to the body, and a hook configured for locking the cover to the body when the cover is closed. However, the hinge is usually positioned on the back side of the electronic device, while the hook is often positioned on the front side of the electronic device, the hook is exposed when the electronic device is open, and thus at risk of being damaged, and unsightly.

Thus, what is needed is an electronic device with a concealed hook.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
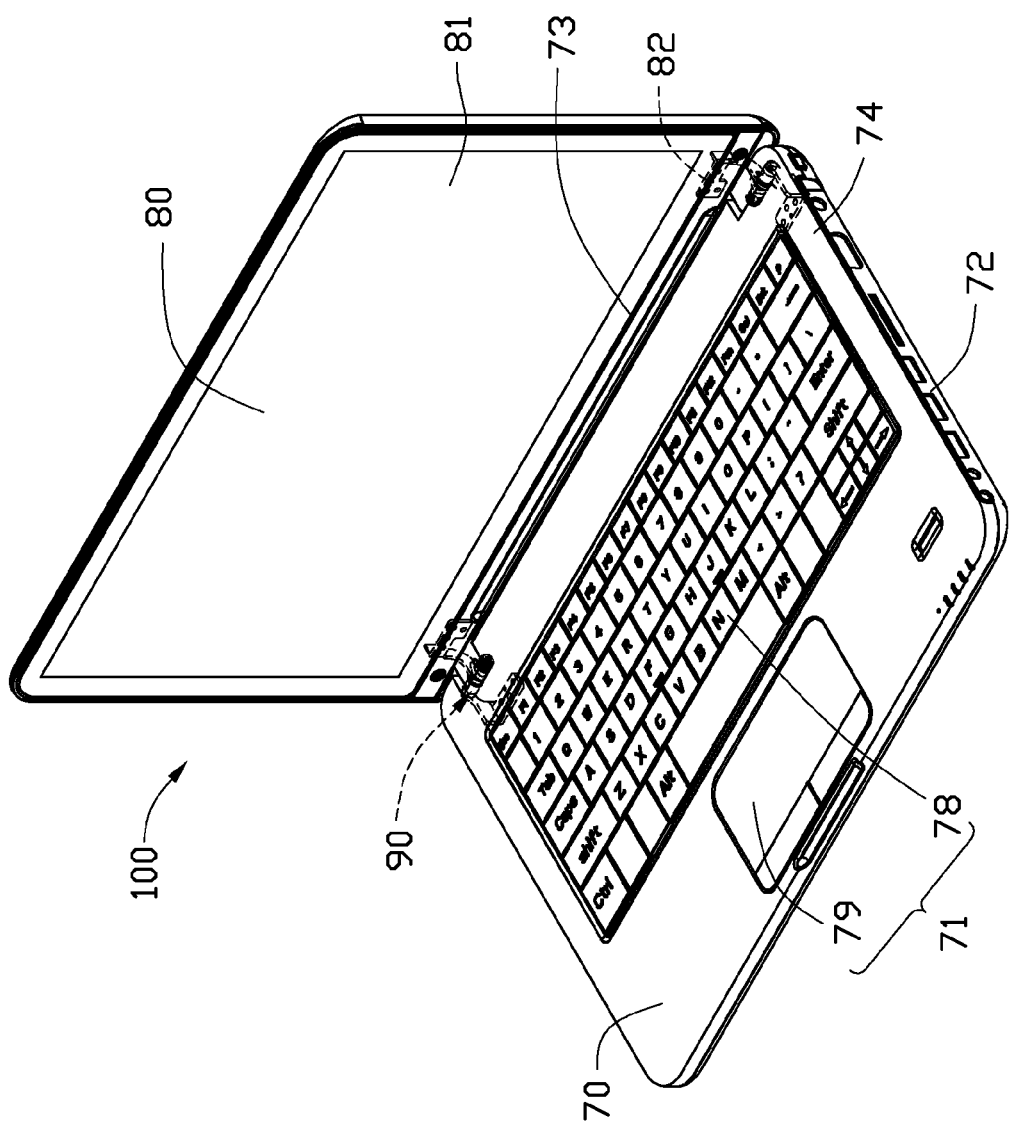
FIG. 1 is an isometric view of an electronic device with a hinge according to an exemplary embodiment.

Referring to FIG. 1, an isometric view of an electronic device 100 with two hinges 90 according to an exemplary embodiment is disclosed. The electronic device 100 includes a main body 70, a cover 80, and the hinges 90. The cover 80 is pivotably mounted and fastened on the main body 70 by the hinges 90, and is able to be automatically opened up from the main body 70 by the action of the hinges 90. The cover 80 includes a display panel 81 and a connection cover 82. The main body 70 includes a back edge 73, a side edge 74, an inner shell 71, and an outer shell 72 fastened to the inner shell 71. The inner shell 71 includes a keyboard 78 and a touch panel 79.

Figure 2:
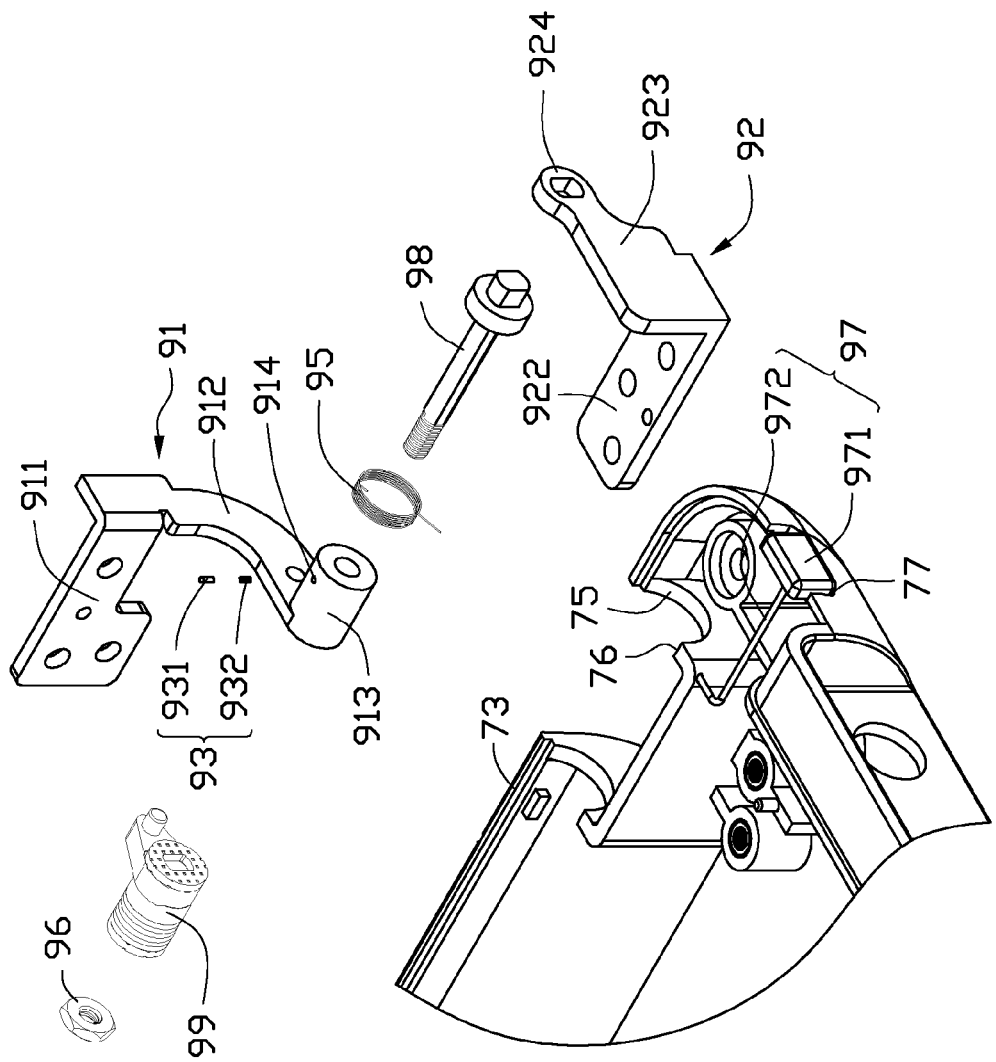
FIG. 2 is an exploded view of the hinge of FIG. 1.

Referring also to FIG. 2, the inner shell 71 and the outer shell 72 cooperate to form a notch 75 at each of two corners where the hinges 90 is placed. Each hinge 90 is received in the notch 75 between the outer shell body 72 and the inner shell body 71, and is covered by the connection cover 82. In the embodiment, the notch 75 is formed at the back edge 73 of the main body 70, columniform, and composed of two semi-circular notches formed in the inner shell body 71 and the outer shell body 72 respectively.

Figure 3:
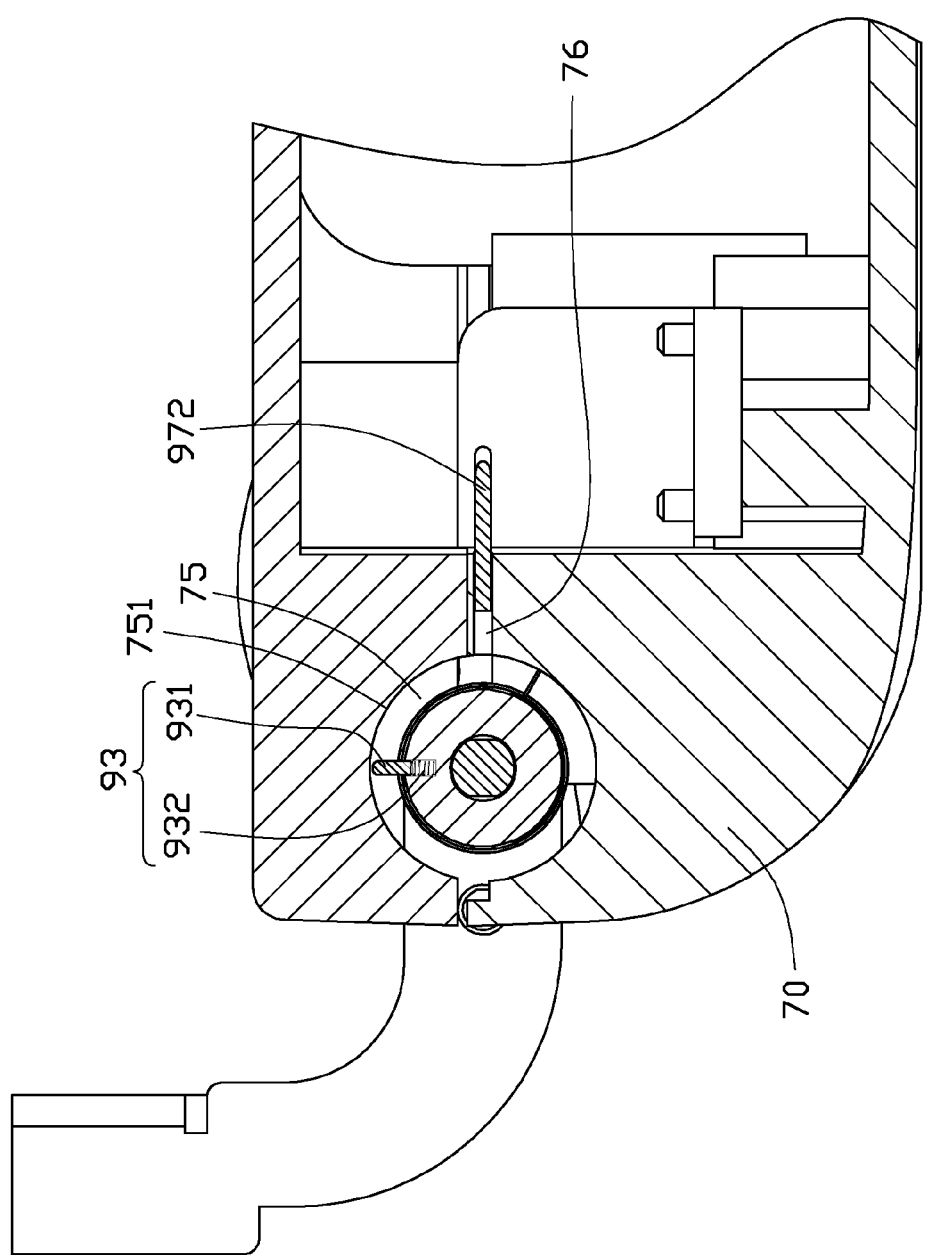
FIG. 3 is a cross-sectional view of the hinge of FIG. 1.

Referring also to FIG. 3, a through hole 76 is defined in the sidewall of the notch 75. A containing groove 77 is defined in the side edge 74 of the main body 70.

Referring also to FIG. 2, the hinge 90 includes a rotatable bracket 91, a fixed bracket 92, a torsion spring 95, a shim assembly 99, a shaft 98, and a locknut 96. The rotatable bracket 91 includes a rotation portion 913 received in the notch 75. The shaft 98 extends through the fixed bracket 92, the torsion spring 95, the rotation portion 913, and the shim assembly 99. The locknut portion 96 is fixed on one end of the shaft 98 adjacent to the shim assembly 99. In the embodiment, one end of the torsion spring 95 is fastened on the rotation portion 913, the other end of the spring 95 is fastened on the main body 70.

The rotatable bracket 91 is substantially Z-shaped, and includes a first fixing element 911 and a first pivot arm 912. One end of the first pivot arm 912 is fastened on the first fixing element 911 and the other end of the first pivot arm 912 is fastened on the rotation portion 913. A positioning hole 914 is formed in outer circumference of the rotation portion 913. The first fixing element 911 is fixed on the cover 80 by screws or other fixing elements.

The fixed bracket 92 is L-shaped, includes a second fixing element 922 and a second pivot arm 923. The second pivot arm 923 is fastened on the second fixing element 922. The second fixing element 922 is fixed on the main body 70 by screws or other fixing element. The free end of the second pivot arm 923 defines a non-circular through hole 924 coupled to the shaft 98, which causes the second pivot arm 923 to be incapable of rotating relative to the shaft 98.

The hinge 90 further includes an elastic hook 93 and a driving element 97. The elastic hook 93 is fixed in the positioning hole 914. In the embodiment, referring also to FIG. 3, the elastic hook 93 includes a positioning column 931 and a spring 932. Two ends of the spring 932 are fixed in the positioning hole 914 and the bottom of the positioning column 931 respectively. The free end of the positioning column 931 is dome shaped and presses against an inner wall 751 of the notch 75. The rotation of the rotation portion 913 enables the positioning column 931 to slide on the inner wall 751 of the notch 75, in the meantime, the spring 932 is compressed. When the positioning column 931 slides to the position of the through hole 76, a part of the positioning column 931 is pressed into the through hole 76 by rebounding of the spring 932, thus locking the cover 80 to the main body 70.

The driving element 97 includes a sliding key 971 and an L-shaped pole 972. The sliding key 971 is movably mounted in the containing groove 77. One end of the pole 972 is fixed in the sliding key 971, the other end of the pole 972 plugs into the through hole 76. By sliding the sliding key 971 along the direction parallel to the side edge 74, the pole 972 can be driven into the through hole 76. When the pole 972 is fully received in the through hole 76, the pole 972 pushes the positioning column 931 out of the through hole 76, thus unlocking the cover 80 from the main body 70.

Figure 4:
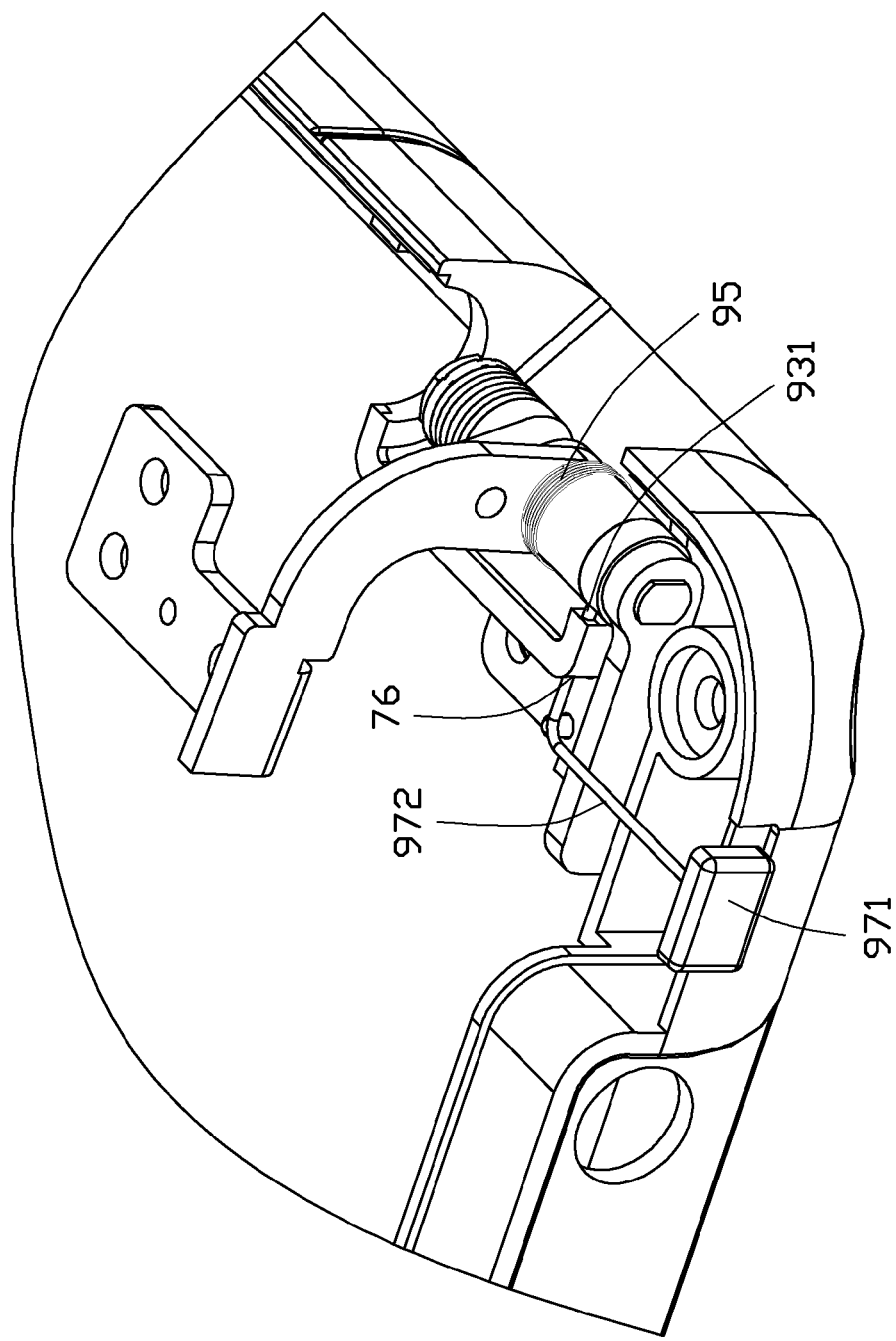
FIG. 4 is a schematic view of a locking member of the hinge of FIG. 1, when the electronic device is fully closed.

Referring also to FIG. 4, when the cover 80 is pressed to abut the main body 70, the torsion spring 95 accumulates torque. The positioning column 931 is operable to be inserted into the through hole 76 to lock the cover 80 to the main body 70.

Figure 5:
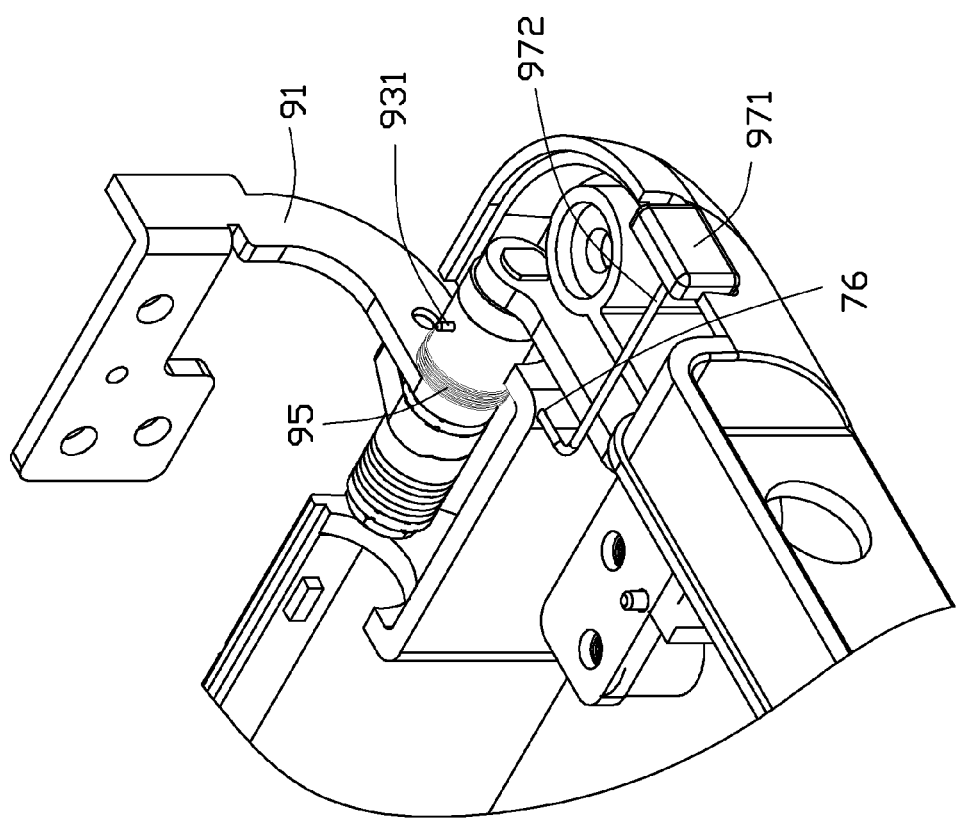
FIG. 5 is a schematic view of the locking member of the hinge of FIG. 1, when the electronic device is fully opened.

Referring to FIG. 5, when the sliding key 971 is slid, the sliding key 971 drives the pole 972 fully into the through hole 76, and pushes the positioning column 931 out of the through hole 76, thus the cover 80 is unlocked. Then the torsion spring 95 rebounds to drive the rotation portion 913 to rotate and pivot the cover 80 open automatically.

Moreover, it is to be understood that the disclosure may be embodied in other forms without departing from the spirit thereof. Thus, the present examples and embodiments are to be considered in all respects as illustrative and not restrictive, and the disclosure is not to be limited to the details given herein.

What is claimed is:

1. An electronic device comprising:
a main body defining a notch, and a through hole in an inner wall of the notch;
a cover; and
a hinge connecting the main body with the cover, wherein the hinge comprises a rotatable bracket with a rotation portion, a fixed bracket fixed on the main body, a shaft, an elastic hook, and a driving element; the shaft extends through the fixed bracket and the rotation portion; the rotatable bracket is fixed on the cover; the rotation portion defines a positioning hole configured for receiving the elastic hook; the elastic hook is operable to be inserted into the through hole to lock the rotatable bracket relative to the fixed bracket; one end of the driving element is slidably received in the through hole, and is configured for pushing the elastic hook out of the through hole to unlock the rotatable bracket relative to the fixed bracket.

2. The electronic device of claim 1, wherein the hinge further comprises a torsion spring, the shaft extends through the torsion spring, one end of the torsion spring is fastened on the rotation portion of the rotatable bracket, the other end of the torsion spring is fastened on the main body, the torsion spring rebounds to drive the rotation portion to rotate and pivot the cover open automatically.

3. The electronic device of claim 1, wherein the hinge further comprises a locknut, the locknut is fixed on one end of the shaft.

4. The electronic device of claim 1, wherein the driving element includes a sliding key and a pole, the pole is L-shaped, one end of the pole is fixed in the sliding key, the other end of the pole plugs into the through hole.

5. The electronic device of claim 4, wherein the main body defines a containing groove, the sliding key is movably mounted in the containing groove.

6. The electronic device of claim 1, wherein the cover comprises a connection cover employed to cover the hinge.

7. The electronic device of claim 1, wherein the notch is configured to receive the rotation portion, the rotation portion rotates to drive the elastic hook to slide along the inner wall of the notch.

8. A hinge applied in an electronic device, comprising:
a rotatable bracket fixed on a cover of the electronic device, wherein the rotatable bracket comprises a rotation portion defining a positioning hole; a fixed bracket fixed on a main body of the electronic device, a shaft extending through the rotation portion of the rotatable bracket and the fixed bracket;
an elastic hook, wherein the elastic hook is received in the positioning hole of the rotation portion, and the elastic hook is operable to be inserted into a through hole defined in the main body to lock the rotatable bracket relative to the fixed bracket; and
a driving element, wherein one end of the driving element is slidably fixed in the through hole, and is configured for pushing the elastic hook out of the through hole to unlock the rotatable bracket relative to the fixed bracket.

9. The hinge of claim 8, wherein the elastic hook includes a positioning column and a spring, two ends of the spring are fixed in the positioning hole and a bottom of the positioning column respectively, and a free end of the positioning column is dome shaped.

10. The hinge of claim 8, wherein the hinge further comprises a torsion spring, the shaft extends through the torsion spring, one end of the torsion spring is fastened on the rotation portion of the rotatable bracket, the other end of the spring is fastened on the main body, the torsion spring rebounds to drive the rotation portion to rotate and pivot the cover open automatically.

11. The hinge of claim 8, wherein the driving element includes a sliding key and a pole, the pole is L-shaped, one end of the pole is fixed in the sliding key, the other end of the pole plugs into the through hole.

12. An electronic device comprising:
a main body defining a notch and a through hole in an inner wall of the notch;
a cover; and
a hinge pivotally connecting the cover to the main body, wherein the hinge comprises a rotatable bracket fixed on the cover and with a rotation portion, a fixed bracket fixed on the main body, a shaft, an elastic hook, and a driving element; the shaft extends through the fixed bracket and the rotation portion; the rotation portion is received in the notch and defines a positioning hole configured for receiving the elastic hook; the hinge rotates to drive the elastic hook to slide along the inner wall of the notch, and the elastic hook inserts into the through hole to lock the hinge; one end of the driving element is slidably received in the through hole, and pushes the elastic hook out of the through hole to unlock the hinge.

13. The electronic device of claim 12, wherein the driving element includes a sliding key and a pole, the pole is L-shaped, one end of the pole is fixed in the sliding key, the other end of the pole plugs into the through hole.

14. The electronic device of claim 13, wherein the main body defines a containing groove, the sliding key is movably mounted in the containing groove.

15. The electronic device of claim 12, wherein the cover comprises a connection cover configured to cover the rotatable portion.

16. The electronic device of claim 12, wherein the hinge further comprises a torsion spring, the shaft extends through the torsion spring, one end of the torsion spring is fastened on the rotation portion, the other end of the torsion spring is fastened on the main body, the torsion spring rebounds to drive the rotation portion to rotate and pivot the cover open automatically.

17. The electronic device of claim 16, wherein the hinge further comprises a locknut, the locknut is fixed on one end of the shaft.

18. The electronic device of claim 12, wherein the elastic hook includes a positioning column and a spring, two ends of the spring are fixed in the positioning hole and a bottom of the positioning column respectively, and a free end of the positioning column is dome shaped.

* * * * *